US008374098B2

(12) United States Patent
Wezelenburg et al.

(10) Patent No.: US 8,374,098 B2
(45) Date of Patent: Feb. 12, 2013

(54) CHECK DATA ENCODING USING PARALLEL LANE ENCODERS

(75) Inventors: Martinus Cornelis Wezelenburg, Kessel-Lo (BE); Antony John Penton, Cambridge (GB); Ken Yi Wong, Cambridge (GB)

(73) Assignee: ARM Limited, Cambridge (GB)

( * ) Notice: Subject to any disclaimer, the term of this patent is extended or adjusted under 35 U.S.C. 154(b) by 473 days.

(21) Appl. No.: 12/588,960

(22) Filed: Nov. 3, 2009

(65) Prior Publication Data
US 2011/0103400 A1    May 5, 2011

(51) Int. Cl.
*H04J 3/24* (2006.01)
*H03M 13/00* (2006.01)

(52) U.S. Cl. ......... 370/252; 370/474; 370/476; 714/758

(58) Field of Classification Search .................. 370/252, 370/389, 392, 474, 476; 714/755, 758
See application file for complete search history.

(56) References Cited

U.S. PATENT DOCUMENTS

| | | | |
|---|---|---|---|
| 6,637,000 B2* | 10/2003 | Rowitch et al. | 714/755 |
| 7,734,183 B2* | 6/2010 | Whitehead | 370/463 |
| 2004/0105409 A1* | 6/2004 | Razoumov et al. | 370/332 |
| 2004/0260996 A1* | 12/2004 | Heppe | 714/755 |
| 2010/0262887 A1* | 10/2010 | Wilson | 714/758 |
| 2011/0099451 A1* | 4/2011 | Wezelenburg et al. | 714/755 |

* cited by examiner

*Primary Examiner* — Kerri Rose
(74) *Attorney, Agent, or Firm* — Nixon & Vanderhye P.C.

(57) ABSTRACT

An encoder for generating check data to accompanying payload data uses parallel lane encoders each using a common encoder matrix. Mask circuitry applies mask values to the lane check data generated by the lane encoders. The mask circuitry generates check data for the K-bits of payload data. The mask values applied by the mask circuitry may be selected so as to bring about a re-ordering of the M-bit words.

26 Claims, 6 Drawing Sheets

US 8,374,098 B2

CHECK DATA ENCODING USING PARALLEL LANE ENCODERS

REFERENCE TO COMPUTER PROGRAM LISTING APPENDIX

A computer program listing appendix is included on a compact disc, and the material on the compact disc is incorporated by reference herein. Two duplicate compact discs are provided and include a computer program listing corresponding to the computer program code included on pages 22-46 of the specification as originally filed.

TECHNICAL FIELD

This technical field relates to data processing systems, and the technology described below relates to the field of generating payload check data from payload data for the purposes of error detection and/or correction.

BACKGROUND

It is known to provide check data in association with payload data. The payload data may, for example, be being read from a memory or transmitted over a data communication channel. Bit errors within the payload data may be detected and/or corrected using the check data. The check data may also provide the ability to detect errors within the check data itself. Such mechanisms for providing check data in association with payload data are beneficial in providing an increased resilience against bit errors.

A problem with the provision of such check data is that the necessary circuits for generating and using the check data add circuit area, cost, complexity and latency to the processing. FIG. 1 of the accompanying drawings illustrates a system in which payload data is received on a data input line 2 and supplied to a multiplexer 4 which can reorder the payload data in dependence upon an order select control signal generated by order select circuit 6. The data may require reordering as it is not supplied in the same order in which it was originally encoded, e.g. memory reads have taken place in a different order, endianess has been changed, or for some other reason. Accordingly, the multiplexer 4 reorders the payload data into the order in which it was subject to encoding when the accompanying payload check data on check data signal line 8 was generated. A decoder 10 serves to decode the reordered payload data and to compare this with the received check data to ensure that the payload data contains no bit errors and/or correct any bit errors which may be present (subject to the limitations of the check data coding). The decoder 10 may also check for bit errors within the check data itself An encoder 12 re-encodes the payload data and generates new check data for output on check data signal line 14.

In the serial approach illustrated in FIG. 1, the critical path of the processing has two major components. Firstly, the order select circuit 6 needs to control the data reordering by the multiplexer 4 before the decoder 10 can commence operation. Secondly, the check data output on check data output line 14 is generated in dependence upon the corrected payload data which is produced by the decoder 10. Both of these aspects disadvantageously increase the latency associated with the processing of the circuitry of FIG. 1.

SUMMARY

An apparatus generates C-bit payload check data from K-bits of payload data formed of N M-bit words, where K=N*M and N and M are integers greater than one, said apparatus comprising:

N lane encoders configured to operate in parallel to each generate lane check data from a respective M-bit word using a common processing operation; and mask circuitry coupled to said N lane encoders and configured to receive lane check data from each of said N lane encoders and to generate said C-bit payload check data.

The technology described in this application provides multiple lane encoders which each operate in a parallel upon a respective M-bit word within the payload data to generate lane check data using a common processing operation, e.g. performing the same mathematical manipulation in each lane. This lane check data is then processed by mask circuitry to generate the C-bit payload check data. This arrangement facilitates a reduction in latency of the processing to generate the C-bit payload check data since the processing in each lane is the same lane order independent and can be performed in parallel.

The lane encoders can operate in a variety of different ways. In some embodiments the lane encoders operate to produce lane check data which has a value given by a matrix multiplication of an encoder matrix with the M-bit word for that lane with the encoder matrix being common for each of the M lane encoders. The use of a common encoder matrix has the consequence that the order in which the M-bit words are supplied to the lane encoders does not matter as each of these lane encoders applies the same encoder matrix and accordingly any issue of reordering can be dealt with at a later time within the mask circuitry. This reduces the critical path delay.

It will be appreciated that the lane encoders may not actually perform a matrix multiplication, rather the value that they produce for the lane check data is the same as that which would be produced by a matrix multiplication even if the circuitry implements the generation of this data in a different manner.

It is also possible that the lane encoders may operate in a different way. In other embodiments the check data for the M-bit word may have a value given by a polynomial division operation performed upon the M-bit word with the polynomial division operation being common for each of the M-lane encoders. This arrangement is also insensitive to the M-bit word order.

The mask circuitry can have a variety of different forms. In at least some embodiments the mask circuitry uses N distinct C-bit mask values, said C-bit payload check data having a value given by binary finite field addition of each of said N distinct C-bit mask values to respective different lane check data to form N C-bit check code portions and binary finite field addition of said N C-bit check code portions to form said C-bit payload check data.

The encoder matrix can have a variety of different forms depending upon the type of encoding desired. In embodiments in which single error correction and double error detection capability is desired, said encoder matrix may have binary elements with values such that said lane check data for each M-bit word concatenated with said M-bit word provides a systematic code with minimum Hamming distance T, where T is one of T=3 and T=4 for said M-bit word.

Furthermore, if single error correction and double error detection capabilities required for the payload check data for the K-bits of payload data then said encoder matrix and said N distinct C-bit mask values are formed such that said C-bit payload check data concatenated with said K-bits of payload data provides a systematic code with minimum Hamming distance T, where T is one of T=3 and T=4 for said K-bits of payload data.

If reordering is required within the payload data, then this may be achieved in embodiments in which said mask circuitry is responsive to an order select signal to select which of said N distinct C-bit mask values are subject to a binary finite field addition with lane check data from which of said N lane encoders.

Within such embodiments the order select signal may be generated such that said K-bits of payload data has associated C-bit input payload check data previously calculated from said K-bits of payload data and said order select signal is controlled such that said C-bit payload check data is formed with a selection of which said N distinct C-bit mask values are subject to a binary finite field addition with lane check data from which of said N lane encoders such that said C-bit payload check data matching said C-bit input payload check data if said payload data is error free.

In systems in which the newly calculated payload check data is to be compared with received payload check data syndrome generating circuitry is provided that is responsive to the input check data and the generated check data so as to generate a syndrome value.

The syndrome value may be generated by a binary finite field addition operation performed upon the input payload check data and the generated payload check data.

The syndrome value generated can be used to select with reduced latency the form of check data which is to be output. In particular, the syndrome value may be used to detect situations in which the payload data is error free and the input check data contains a single bit error. In this case, the generated check data will be correct as it has been generated from error free payload data and can be directly selected for output by a multiplexer in place of the input check data. This exploits the recognition that some error codings support at most the correction of a single bit error and accordingly if the payload data is error free and the check data contains a single bit error, then the generated check data from the error free payload data will be correct.

Example embodiments may be used to split the K-bits of payload data into multiple (Z) sections of payload data with the same or differing sizes. When splitting in this way, the mask circuitry may be divided into corresponding sections to the sections of payload data to be formed and the sections of mask circuitry controlled to generate check data that either, or both, matches the input check data for the full K-bits of payload data or provides new check data providing a systematic code for the section of payload data which is being separated out from the whole.

In some embodiments the systematic code for the section of K(z) bits of payload data has a minimum Hamming distance T, where T is one of T=3 and T=4.

For a first of the Z sections of payload data, only the partial check data need be formed as this can provide a systematic code for the first of the Z sections of payload data as well as forming a correct portion of the check data for the K-bits of payload data when being checked as a whole.

It may assist in simplifying processing and reducing energy consumption if one of the mask values used in calculating the partial check data is all zeros and one of the mask values used in calculating the section check data is also all zeros. These mask values may be arranged to be the most common case mask values used when the data is error free.

Other example embodiments can be used to merge multiple sections (Z) of payload data so as to form K bits of payload data. Each of the sections of payload data can have an associated input payload check data calculated from that section and providing bit error protection for that section.

In this form of embodiment, the mask circuitry comprises Z mask circuitry sections each corresponding to one of the Z sections of payload data to be merged and each of the mask circuitry sections forms partial check data and section check data. The section check data relates to the section itself and provides a systematic code for the section. The partial check data forms part of a code for the full K bits of payload data. For some of the sections the partial check data and the section check data may be the same and only one set of mask circuitry (mask values) need be used to generate such values.

Another aspect includes an apparatus for generating C-bit payload check data from K-bits of payload data having associated C-bit input payload check data previously calculated from said K-bits of payload data, said apparatus comprising:

check code generating circuitry configured to generate C-bit candidate payload check data;

syndrome generating circuitry responsive to said C-bit input check data and said C-bit check data to generate a syndrome value given by performing a binary finite field addition operation upon said C-bit input payload check data and said C-bit payload check data to generate said syndrome value;

error detection circuitry responsive to said syndrome value to detect when said K-bits of payload data are error free and said C-bit input payload check data contains a single bit error; and multiplexer circuitry responsive to said error detection circuitry to select said C-bit payload check data to be associated with said K-bits of payload data in place of said C-bit input payload check data when said C-bit input payload check data is detected as containing a single bit error.

A further aspect provides an apparatus for generating C-bit payload check data from K-bits of payload data formed of N M-bit words, where K=N*M and N and M are integers greater than one, said apparatus comprising:

N lane encoder means for operating in parallel to each generate lane check data from a respective M-bit word using a common processing operation; and mask means coupled to said N lane encoder means receiving lane check data from each of said N lane encoder means and for generating said C-bit payload check data A further aspect provides an apparatus for generating C-bit payload check data from K-bits of payload data having associated C-bit input payload check data previously calculated from said K-bits of payload data, said apparatus comprising:

check code generating means for generating C-bit candidate payload check data;

syndrome generating means responsive to said C-bit input check data and said C-bit check data for generating a syndrome value given by performing a binary finite field addition operation upon said C-bit input payload check data and said C-bit payload check data to generate said syndrome value;

error detection means responsive to said syndrome value for detecting when said K-bits of payload data are error free and said C-bit input payload check data contains a single bit error; and multiplexer means responsive to said error detection circuitry for selecting said C-bit payload check data to be associated with said K-bits of payload data in place of said C-bit input payload check data when said C-bit input payload check data is detected as containing a single bit error.

A further aspect provides a method of generating C-bit payload check data from K-bits of payload data formed of N M-bit words, where K=N*M and N and M are integers greater than one, said method comprising the steps of:

generating in parallel lane check data from a respective M-bit word using a common processing operation; and generating said C-bit payload check data from said lane check data generated in parallel.

Viewed from a further aspect the present invention provides a method of generating C-bit payload check data from K-bits of payload data having associated C-bit input payload check data previously calculated from said K-bits of payload data, said method comprising the steps of:

generating C-bit candidate payload check data;

in response to said C-bit input check data and said C-bit check data, generating a syndrome value given by performing a binary finite field addition operation upon said C-bit input payload check data and said C-bit payload check data to generate said syndrome value;

in response to said syndrome value, detecting when said K-bits of payload data are error free and said C-bit input payload check data contains a single bit error; and selecting said C-bit payload check data to be associated with said K-bits of payload data in place of said C-bit input payload check data when said C-bit input payload check data is detected as containing a single bit error.

The above, and other objects, features and advantages will be apparent from the following detailed description of illustrative embodiments which is to be read in connection with the accompanying drawings.

DESCRIPTION OF EXAMPLE EMBODIMENTS

Figure 2:
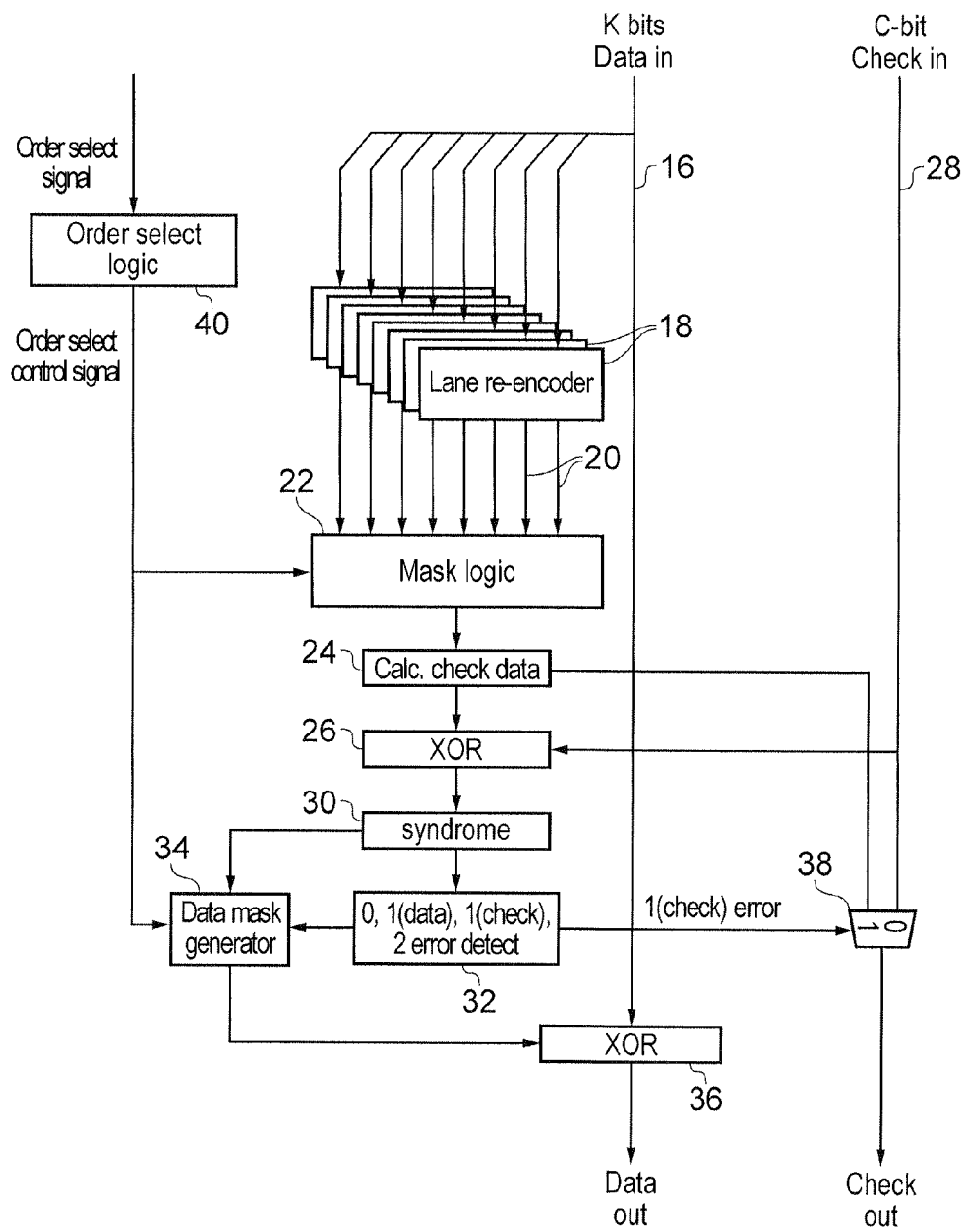
FIG. 2 schematically illustrates a parallel implementation of a data reordering decode and re-encode operation.

FIG. 2 schematically illustrates a parallel implementation of a data re-ordering decode and re-code operation. K-bits of payload data are received upon input data line 16. These K-bits of payload data are divided into N M-bit words of payload data which are fed to respective lane encoders 18. These lane encoders generate in parallel using a common processing operation (e.g. the same encoder matrix or the same polynomial divide) lane check data on lane check data signal lines 20. The lane check data is supplied in parallel to mask circuitry 22. The mask circuitry generates C-bit payload check data which is stored within register 24. An XOR circuit 26 combines the generated check data with the C-bit input check data from input check data line 28 to generate a syndrome value which is stored within a syndrome register 30. Error detector circuitry 32 is responsive to the syndrome value within the syndrome register 30 to identify that either that no bit errors are present, that one correctable bit error is present within the K-bits of payload data, that one correctable error is present within the C-bits of check data or that two errors are present (not correctable).

This is the capability when the check code is one which provides single error correction and double error detection capability. These codes are ones which when concatenated with their associated payload data provide a systematic code with a minimum Hamming distance T where T is one of T=3 and T=4. Such single error correction and double error detection capability may be provided for the full bits of payload data or for each M-bit word of payload data.

If an error is present within the K-bits of payload data, then a data mask generator 34 is responsive to a signal from the error detector 32 to control a further XOR circuit 36 to apply an appropriate mask to the input K-bits of payload data so as to correct the single bit error within that payload data that has been detected. If the error detector 32 detects a single bit error within the check data, then the C-bit input check data on signal line 28 is known to be incorrect.

However, as only a single error is present, then the K bits of payload data will be correct and accordingly the C-bit generated check data which was calculated by the lane encoders 18 and the mask circuitry 22 will be correct. Thus, the error detector 32 generates a control signal supplied to a multiplexer 38 which selects the newly generated check data from within a register 24 for output concatenated with the K-bits of payload data.

The masks applied by the mask circuitry 22 have N distinct C-bit mask values. These mask values may be selected under control of a order select circuit 40 to have the effect of reordering the M-bit words. The encoder matrix applied by each of the lane encoders 18 is the same and accordingly the difference in the processing applied to each M-bit word is brought about by the mask value applied in the mask circuitry 22. Thus, since the lane encoders 18 may commence operation directly from the received K bits of payload data without waiting for the order selection to be resolved, latency through the system may be reduced as the order select control signal supplied to the mask circuitry 22 need not be available until the lane check data is output from the lane encoders 18. The mask circuitry 22 uses the N distinct C-bit mask values to generate the C-bit payload data supplied to the register 24 with a value given by a binary finite field addition of each of the N distinct C-bit mask values to a respective different lane check data value to form N C-bit check code portions with these then being subject to another binary finite field addition among the portions to the form the final C-bit payload check data which is stored into the register 24. One of the mask values (the most used) can be arranged to have all zero values so as to reduce the amount of processing required.

It will be appreciated that the processing performed by the lane encoders 18 and the mask circuitry 22 has the mathematical effect described above in relation to matrix multiplication and binary finite field addition. However, the actual form of the circuitry and the particular implementation of the processing may not follow these mathematical forms rather that it produces the same output value as would be produced by those mathematical manipulations.

In the above embodiment the lane encoders 18 perform matrix multiplication using a common encoder matrix. In other embodiments it is possible that the lane encoders 18 may generate the lane check data by performing a polynomial division operation upon the M-bit words with the polynomial division operation being common for each of the N lane encoders. This polynomial division operation may accordingly also be performed in parallel in advance of knowing the order select control signal as the polynomial division operation is common across the different lanes.

In the embodiment of FIG. 2, the encoder matrix and the mask values are selected to provide a systematic code for concatenation with the K-bits of payload data. This systematic code is arranged to have the property of providing single error correction double error detection capability. This is equivalent to ensuring a minimum Hamming distance T where T is one of T=3 and T=4 for the K-bits of payload data.

Figure 3:
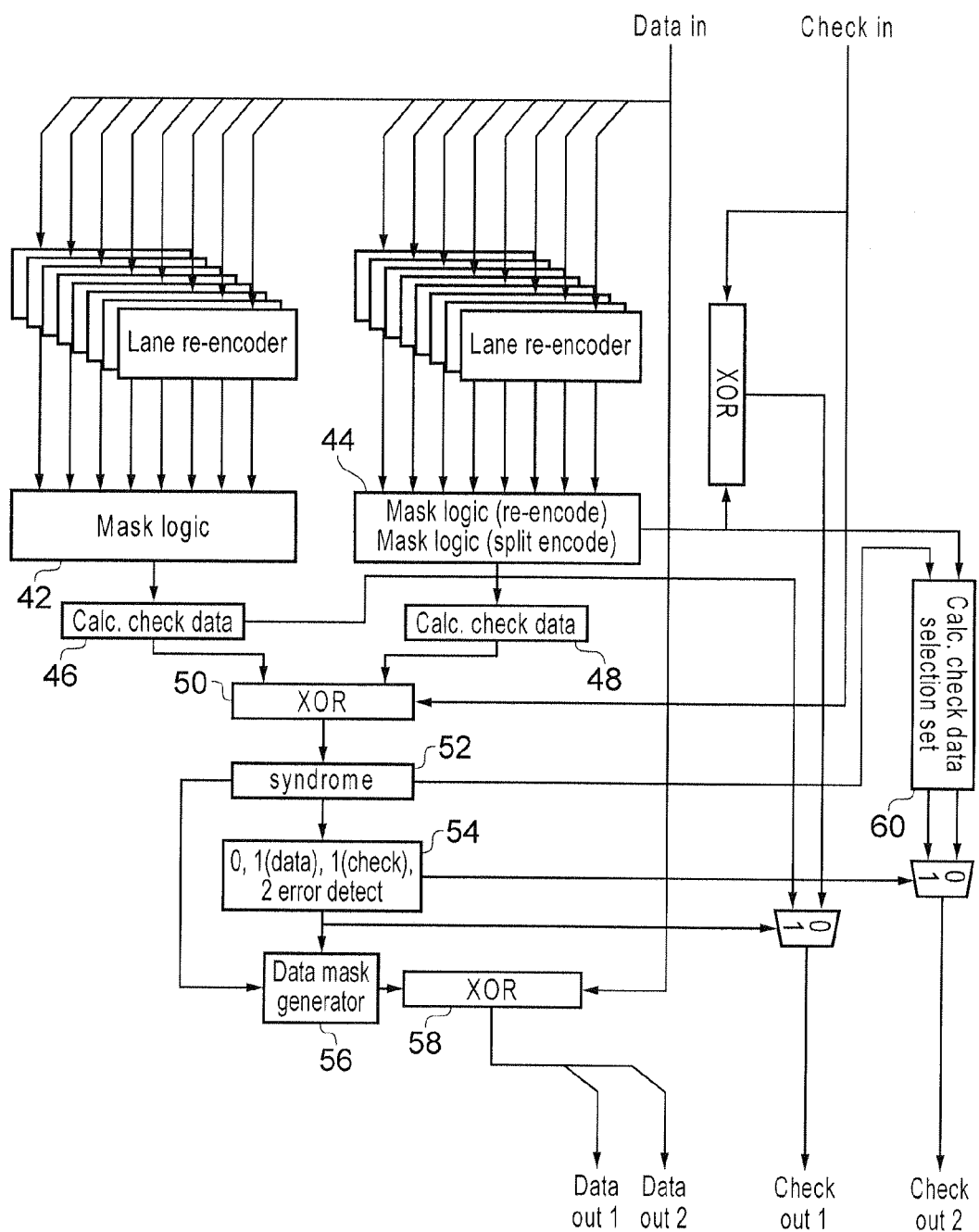
FIG. 3 schematically illustrates a parallel implementation of a bus-splitting decode and re-code operation.

FIG. 3 of the accompanying drawings schematically illustrates a parallel implementation of a bus-splitting decode and re-encode operation. In this example embodiment, the K bits of payload data comprises two sections of payload data. This is only one example and the bus-splitting may be performed into greater than two sections if desired. Each of the sections of payload data is in this example is sub-divided into a number of M-bit words. It will be appreciated that it is possible for a section to contain only a single word if desired. It is also possible that the word size may differ between sections or within sections.

The mask circuitry is also divided into mask circuitry sections 42, 44. The mask circuitry section 42 can be considered as corresponding to the first section of the payload data and generates a partial check code in relation to the first set of bits of the payload data. The second mask circuitry section 44 also generates a partial check code value as well as a section check code value. The partial check code values are stored within registers 46 and 48 and then supplied to an XOR circuit 50 where they are compared with the input check data for the full K bits of payload data. This comparison generates a syndrome value within syndrome register 52 which is subject to analysis by the error detector 54. The partial check code data from the registers 46 and 46 is concatenated into a form which should match the input check data if the payload data and the input check data are both error free. If the syndrome value indicates that the newly generated check data assembled from the two partial check data values and the input check data do not match, then the error detector 54 determines whether the bit error is a single bit error within the payload data, a single bit error within the input check data or two errors which are uncorrectable. If there is a single bit error within the payload data, then a data mask generator circuit 56 generates a mask value supplied to a further XOR circuit 58 where the input payload data is subject to single bit error correction.

The input payload data is separated out into two buses respectively being each of K/2 bits in size. Each of the split portions of payload data requires a C-bit check data value to accompany it. The first section of payload data may use the partial check data calculated by the mask circuitry circuit section 42 directly if the input check data is in error. Alternatively, if the input check data is correct, then the first portion of this may be used as the check data for the first section of the payload data.

In respect of the second section of the payload data, the mask circuitry section 44 generates section check data for the section of the payload data based upon the assumption that the payload data is error free together with a selection of section check data values each based upon a different bit error within the section of payload data. The syndrome value together with the error detector 54 can then control check data selection circuitry 60 to select an appropriate section check data value to be associated with the second portion of payload data that is output.

The embodiment of FIG. 3 has been shown without M-bit word reordering. It will be appreciated that the reordering functionality of FIG. 2 could be combined with the bus-splitting functionality of FIG. 3 in other embodiments.

Figure 4:
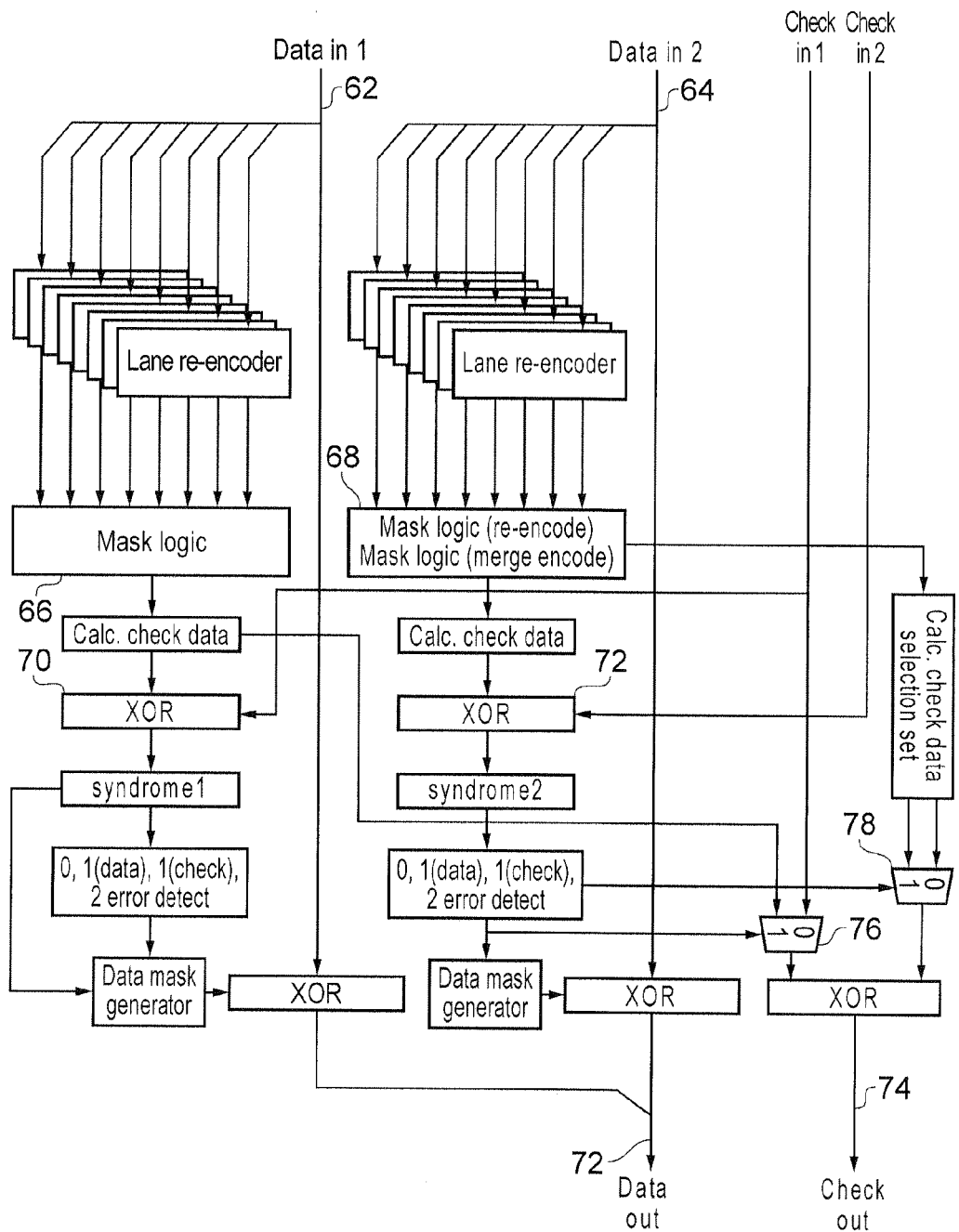
FIG. 4 schematically illustrates a parallel implementation of a bus-merging decode and re-encode operation.

FIG. 4 schematically illustrates a parallel implementation of bus-merging decode and re-encode operation. In this embodiment the K-bits of payload data is supplied on two input data buses 62, 64 which each carry K/2 bits of data. In this example the data being merged is two equal size K/2 bit sections whereas in general the sections need not have the same size and may be more than two in number. Each of the sections of payload data has associated input check data.

The input sections of payload data are split into respective M-bit words which are subject to lane encoding using a common encoder matrix or polynomial divide operation depending upon the implementation. The mask circuitry is split into two mask circuitry sections 66, 68. Each of these mask circuitry sections 66, 68 generates check data which is compared with the respective input check data using XOR circuitry 70, 72 in the different channels. If a single bit error within the section of payload data is detected, then this may be corrected within the channel concerned. The appropriately corrected (if necessary) payload data from the two channels is merged to form the K-bits of output payload data on signal line 72.

The mask circuitry section 68 generates check data which serves both as a partial check data value and a section check data value. The section check data value corresponds to the input check data value for that section of payload data. The partial check data value is used to form an output check data value on signal line 74 which will accompany the merged K bits of payload data The mask circuitry section 68 generates both a section check data value used to check that section of payload data as well as a partial check data value which is combined with the partial check data value from the mask circuitry section 66 to form the output check data value.

As the payload data within the first section may contain an error, it is possible that the partial check data value generated by the mask circuitry section 66 is incorrect and in this case the multiplexer 76 selects the first input check data value to form part of the output check data value from the circuitry as a whole. In a similar way, the second section of the payload data used by the mask circuitry section 68 may also contain an error. Thus, the mask circuitry section 68 generates multiple partial check data values each corresponding to a different potential bit error within the section of payload data. Depending upon whether or not a bit error is detected within the section of payload data concerned, a multiplexer 78 selects the appropriate partial check data value from the mask circuitry section 68 for combination with the partial check data value from the mask circuitry section 66 to form the output check data value.

Figure 5:
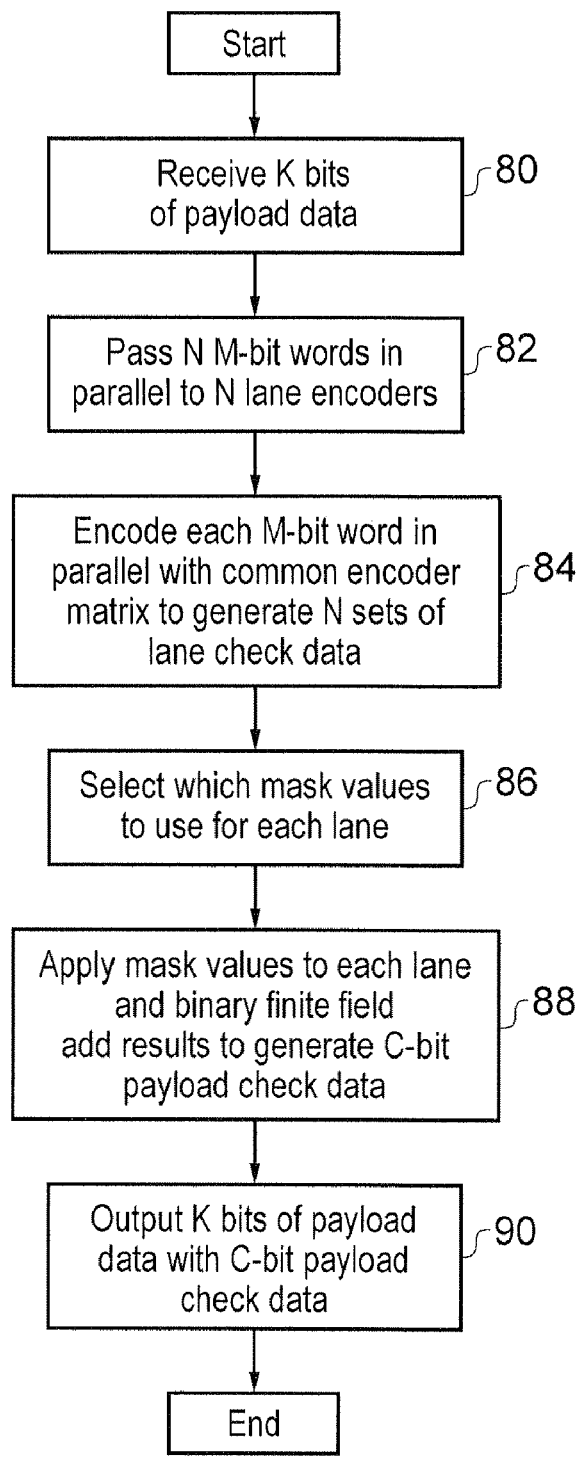
FIG. 5 is a flow diagram schematically illustrating a method for parallel encoding.

FIG. 5 is a flow diagram schematically illustrating the parallel implementation of the encoding of the present technique. At step 80 K bits of payload data are received. At step 82 these K bits of payload data are split into N M-bit words which are supplied in parallel to N lane encoders. At step 84 each of the lane encoders encodes a respective M-bit word using a common encoder matrix (or other common processing operation) to generate N sets of lane check data. At step 86 the mask values which are to be used to mask circuitry associated with different lanes of the processing are selected. These mask values may be selected so as to bring about a reordering of the M-bit words. At step 88 the mask values are applied to each lane by performing a binary finite field addition of the mask value with the lane check data for that lane to form C-bit check code portions which are then themselves subject to binary finite field addition so as together form the C-bit payload check data which is to be output. Step 90 outputs the K-bits of payload data together with the C-bit payload check data calculated by the binary finite field addition of step 88.

Figure 6:
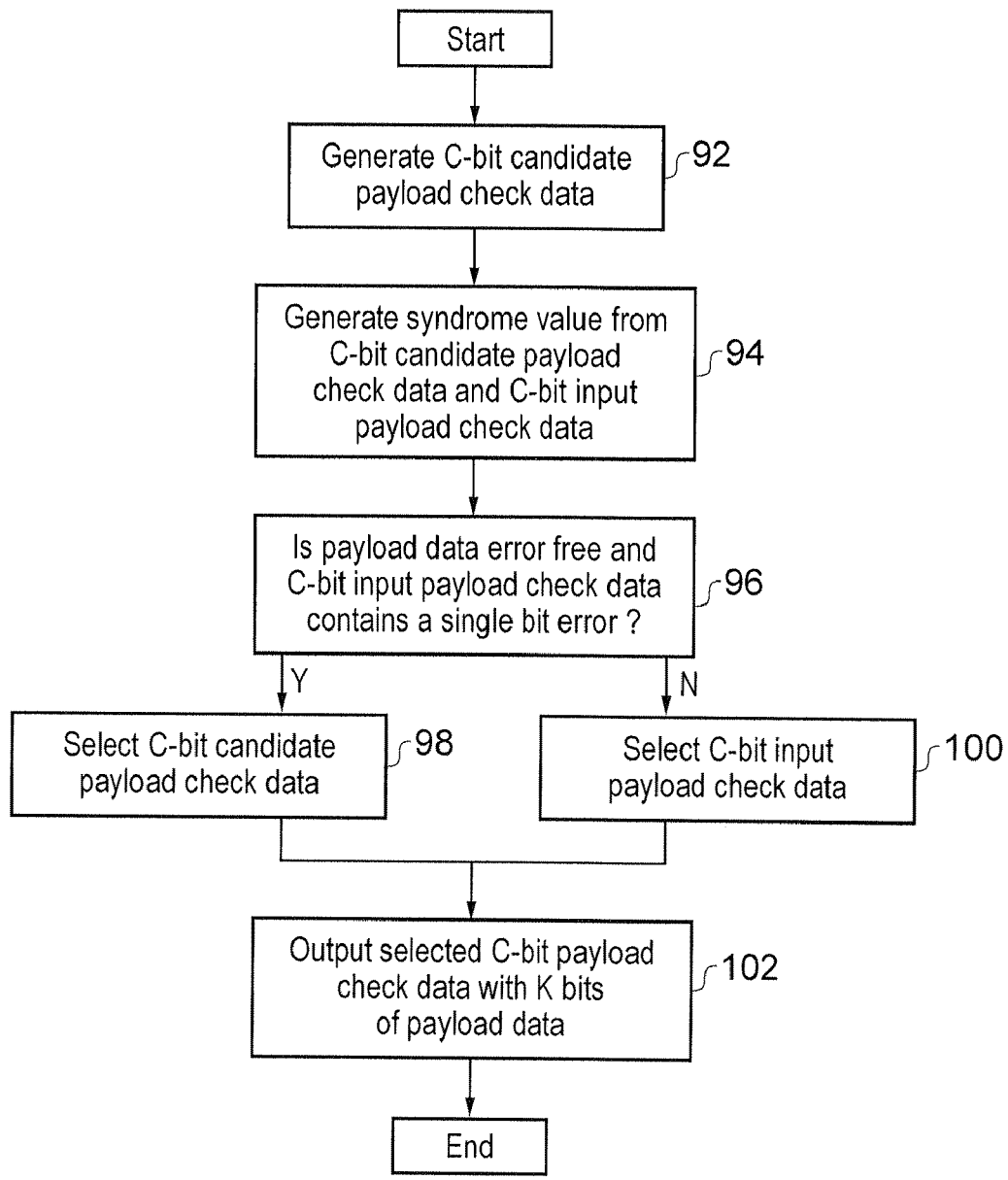
FIG. 6 is a flow diagram schematically illustrating selection of payload check data in dependence upon a generated syndrome value.

FIG. 6 is a flow diagram schematically illustrating selection between an input payload check data value and a calculated payload check data value. At step 92 a candidate payload check data value is calculated from input payload data. Step 94 generates a syndrome value from the candidate payload check data and the input payload check data. The syndrome value indicates whether an error is present within the payload data or an error is present within the input check data. In the circumstance where the payload data is error free and the input payload check data contains a single bit error, then processing may continue using the candidate payload check data in place of the input payload check data since the associated payload data is error free. If the determination at step 96 is that the payload data is error free and the input payload check data contains a single bit error, then processing proceeds to step 98 where the candidate payload check data is selected. Alternatively, step 100 selects the input payload check data for further use. In the case of processing proceeding via step 100, it may be that the syndrome value indicates that the payload data contains a bit error which is then corrected using the input check data. At step 102 the selected payload check data is output together with the associated payload data.

There is given below further details of example codings which may be used in accordance with the present techniques.
Parallel Logic SECDED Codes for Re-Encode and Bus-Split and Bus-Merge For conventional codecs, the computed checksum bits depend on the exact input sequence of data bits. Thus in case of data re-ordering the data order should be corrected before decoding or re-encoding. This approach places the data re-order circuitry in series with the SECDED codec on a critical path.

The code described in this section avoids this problem by deriving the SECDED code from a 2-Dimensional (2D) code, which is order invariant over one dimension. In this case the order invariant part of the code computation can be performed in parallel with the computation of an order dependent correction term, thus reducing the critical path.

In addition the 2D property permits very efficient bus-merge and bus-split decoding and re-encoding, where the decoding and re-encoding steps are computed in parallel with a error dependent correction term on the final output. Both parallel compute and circuit timing advantages are highlighted at the end of this paragraph.

The product code $(N_1, K_1, d_1) \times (N_2, K_2, d_2)$ is an $(N_1 \times N_2, K_1 \times K_2, d_1 \times d_2)$ code. for SECDED d must be 4, thus a 2D parity check code with $d_1=d_2=2$, $d_1 \times d_2=4$ is SECDED.

A reduced product code can be formed by removing the $(N_1-K_1)*(N_2-K_2)$ "checks on checks".

For those codes, the minimum distance is not the product, but the sum of the minimum distances of the constituent codes: $d=d_1+d_2$, which in the case of a 2D parity check code is also 4 and the code is thus SECDED. As describe above the usual way to create a SECDED code is by shortening an (N, K, 4) extended Hamming code. Since both cases are systematic linear block codes, with an identical data payload $K=K_1 \times K_2$, the only difference is in the parity section. From this follows that there is a linear relation between the parity bits of the product code and the checksum bits of the extended Hamming code.

Since the reduced product code has the same minimum distance as the regular product code, only $K_1+K_2$ parity bits of the product code are needed.

The pseudo code below exemplifies the computation of the checksum for the regular SECDED code and the one derived from the 2D product code. Regular encoding of the parity check C for a (39,32,4) is:

```
unsigned char C=0x00;
for (i=0;i<32;i++)
{
    unsigned char Xi = X[i];
```

```
    if (Xi)
        C ^= Gp[i];
}
```

Where $G_p[32]$ is the checksum section of the generator matrix, as before. For the 2D parity check code with $K_1=8$ and $K_2=4$, we have:

```
unsigned char C=0x00;
for (i=0,k=0;i<32;i+=8,k++)
    for (j=0;j<8;j++)
    {
        unsigned char Xi = X[i+j];
        /* 2D parity checks */
        if (Xi)
        {
            Pk[k] ^= 1;
            Pj[j] ^= 1;
        }
    }
```

Followed by the conversion process:

```
for (j=0;j<8;j++)
{
    if (Pj[j])
        C ^= Gp1D[j];
}
for (i=0,k=0;i<32;i+=8,k++)
{
    if (Pk[k])
        C ^= mask[k];
}
```

Where $G_p1D[8]$ is the checksum section of a SECDED code over one dimension, in this example it has K=8. The relation between $G_p1D[8]$ and $G_p[32]$ above is through the vector mask[4]. $G_p[32]$ is a concatenation of $[G_p1D[8]:^\wedge \text{mask}[0], G_p1D[8]:^\wedge \text{mask}[1], G_p1D[8]:^\wedge \text{mask}[2], G_p1D[8]:^\wedge \text{mask}[3]]$, Where ":^" means that the mask is applied to each entry in $G_p1D[8]$. Only the application of the masks is (Byte) order dependent, and in the case of a bus-splitting and bus-merging SECDED codec bridge, for example with $2 \times (39, 32, 4) \rightarrow (72, 64, 4)$ or $(72, 64, 4) \rightarrow 2 \times (39, 32, 4)$, the encoding by $G_p1D[8]$ is the same for all data and only the masks differ for the high and low words in the bridge.

There a multiple possible codes satisfying the order invariance constraint and from those alternatives a code can be picked which either minimises implementation cost or maximises the triple error detection probability as described in the sections 1.1 and 1.2 above. Since the purpose of this construction is to optimise circuit timing, one particular metric is the optimisation of the masks. The minimum mask weight for SECDED codes is two.

TABLE 1

Minimum weight masks for K = 32 and K = 64 bus-split and bus-merge SECDED codes

|       | mask[0] | mask[1] | mask[2] | mask[3] | mask[4] | mask[5] | mask[6] | mask[7] |
|-------|---------|---------|---------|---------|---------|---------|---------|---------|
| $b_0$ | 0 | 1 | 0 | 0 | 0 | 1 | 0 | 0 |
| $b_1$ | 0 | 1 | 0 | 0 | 0 | 0 | 0 | 0 |
| $b_2$ | 0 | 0 | 1 | 0 | 0 | 0 | 1 | 0 |
| $b_3$ | 0 | 0 | 1 | 0 | 0 | 0 | 0 | 0 |
| $b_4$ | 0 | 0 | 0 | 1 | 0 | 0 | 0 | 1 |
| $b_5$ | 0 | 0 | 0 | 1 | 0 | 0 | 0 | 0 |
| $b_6$ | 0 | 0 | 0 | 0 | 1 | 0 | 0 | 0 |
| $b_7$ | 0 | 0 | 0 | 0 | 1 | 1 | 1 | 1 |

The best codes on this category can be found by (directed) search.

Figure 1:
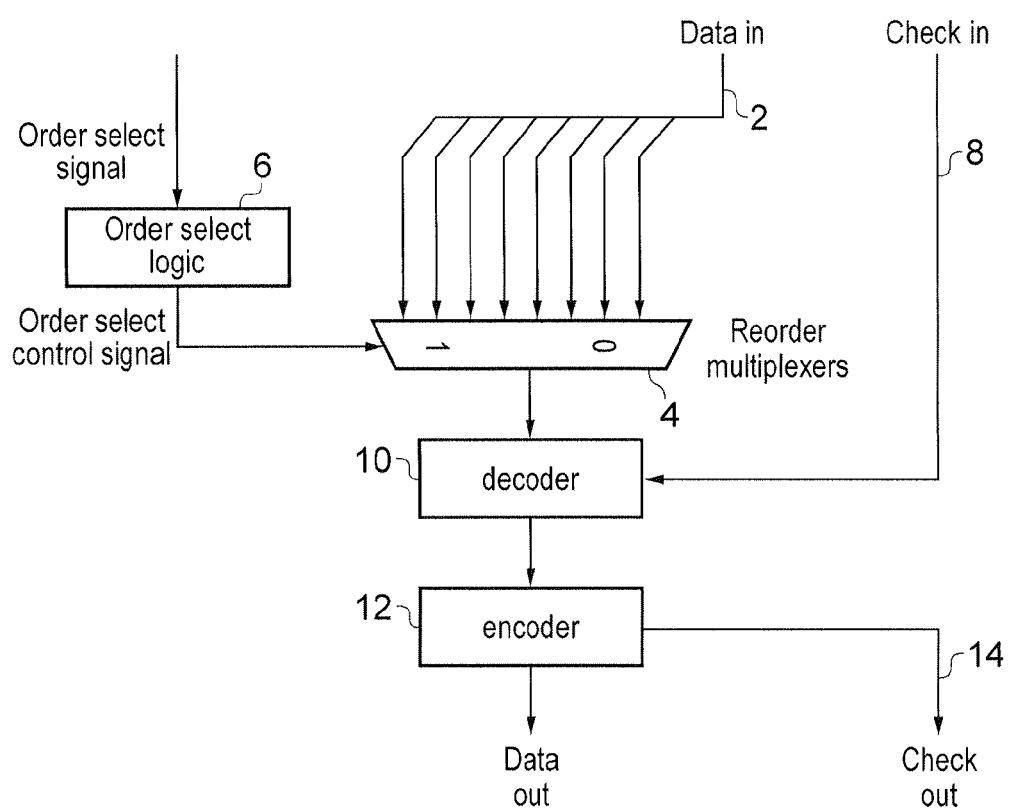
FIG. 1 schematically illustrates a serial implementation of a data reordering decode and re-encode function.

For the serial approach of FIG. 1, the critical path has two aspects. Firstly the order select logic which controls the data reordering multiplexers before the decoder. Secondly, the dependency of the check output, on the corrected result. The latter aspect in more detail: The difference between the check output and the check input is the contribution of the column of the matrix $G_p$ corresponding to the erroneous bit. The determination of the appropriate column can be somewhat accelerated by observing that there is at most one bit error to be corrected, but nevertheless the update of the check input into the check output depends on the matrix $G_p$.

In a SECDED code derived from a 2D parity check code used in the system of FIG. 2, both critical path issues associated with the approach depicted in FIG. 1 are solved. Firstly the lane (re)encoder operates in an identical fashion on all of the input words, while only the mask logic, combining the results and forming the final calculated check data, depends on the input word order. Thus the order select logic can operate in parallel with lane (re)encoder. Secondly since the code can correct at most one error, and the output is unusable in the case of two or more detected errors, this property can be used to avoid the need to correct the input check data. In the case of one error only one of either the data input or the check input is in error. In the former case the input check data is correct while in the latter the calculated check data is correct. Evaluation of the syndrome indicates which case is true and thus whether to select the input check data or the calculated check data.

The splitting and merging small codes from and to larger codes can also be computed fully in parallel with a minimal critical path through the logic. For all codes, the lane (re)encoders are identical and only the masks are different, as can be seen for example in Table 1. The check data for a large code is the sum of the partial check data sums of small (partial) codes. In fact the contribution of the first half of the calculated check data for the large code is identical to that of the small code. The second half of the large code differs, but the difference is only due to the masks, not due to the lane code.

For the bus merging code circuit depicted in FIG. 4, the fact that the decoder has only to cope with a single error in either the data, or the check bits, the contribution of the first bus, or the first half of the data can be selected as with the circuit in FIG. 2. For the second half the situation is different, but the same principle applies. If there is an error on the data of the second bus, or in the second half of the data, the second bus input check is correct. Although due it cannot be applied directly to output check, the only difference between its value and the required value is due to differences in the masks, thus again independent of the lane (re)encoders. However, since the error can have occurred in each of the lanes associated with the second bus, the actual value depends on identification of the lane in which the error occurred. Typically there are few lanes, hence, as depicted in FIG. 3, each of the possible outcomes is independent of the error position and can thus be pre-computed in parallel with the syndrome computation circuitry. When the lane with the bit error has been identified, the correct pre-computed result can be selected. In the case where the error was in the second check data, then the calculated check data from the proper mask set is correct and can be selected.

For the bus split code circuit depicted in FIG. 3 below, the actual computation is different and adapted to the requirements of the decoding and re-encoding equations, but the concept is identical to the explanation given above. The check output for the first lane is either equal to the calculated result, or equal to the input check data with the contribution of the second half of the data subtracted from it. Similarly the possible results for the second bus check data are either the result calculated from the second half of the data with the appropriate mask set, or the one of multiple pre-computed results obtained by subtracting the mask differences from the syndrome. Thus as with the circuit in FIG. 4 none of those results depends on the lane (re)encoding matrices, only on the masks.

A systematic way to derive the parallel SECDED codes is by the following construction using masks derived from the lane addresses:

For lane addressing with K lanes, under the condition that the word size M is at least four, we can form a SECDED code with the minimum number of required check data bits: For the common case with the number of bits per lane $M=2^m$ and $K=2^n$ and the total number of bits $T=K \cdot M$.

$$(2^{n+m}+n+m+2, 2^{n+m}, 4) \qquad (19)$$

The 2D parity check matrices from that construction can be reshaped to a 1D representation, which have the effect of repetition matrices. The subscript denotes the dimension.

The repetition matrix $P_1$ has size K×T and formed by M interleaved K×K identity matrices. The matrix $P_2$ has size M×T and is formed by concatenating K identity matrices of size M×M.

$$P_1 = \begin{bmatrix} 1 & 1 & 1 & 1 & 1 & \ldots & 1 & 0 & 0 & 0 & 0 & 0 & 0 & 0 & 0 & 0 & & & & & & & & \\ 0 & 0 & 0 & 0 & 0 & & 0 & 1 & 1 & 1 & 1 & 1 & \ldots & 1 & 0 & 0 & & & \emptyset & & & & & \\ & & & & & & & & & & & & 1 & 1 & \ldots & & & & & & & & & \\ & & & & & & & & & & & & & & \ddots & & & & & & & & & \\ & & & & \emptyset & & & & & & & & & & & \ldots & 1 & 0 & 0 & 0 & 0 & 0 & & 0 \\ & & & & & & & & & & & & & & & & 0 & 1 & 1 & 1 & 1 & 1 & \ldots & 1 \end{bmatrix} \quad (20)$$

$$P_2 = \begin{bmatrix} 1 & & & & 1 & & & & 1 & & & & 1 & & & \\ & 1 & & \emptyset & & 1 & & \emptyset & & 1 & & \emptyset & & 1 & & \emptyset \\ & & 1 & & & & 1 & & & & 1 & & & & 1 & \\ \emptyset & & \ddots & & \emptyset & & \ddots & & \emptyset & & \ddots & \ddots & \emptyset & & \ddots & \\ & & & 1 & & & & 1 & & & & 1 & & & & 1 \end{bmatrix}$$

The lane address matrix $M_1$ has size $(n+m+2) \times K$. The first n rows are as the first n rows of $G_p$ in equation (14). And thus contain the K lane addresses. The next row contains the auxiliary bit to yield even parity over the columns of $M_1$. The last m+1 rows are zero.

$$M_1 = \begin{bmatrix} 0 & 1 & 0 & 1 & 0 & 1 & 0 & 1 & 0 & 1 & 0 & \ldots & 0 & 1 & 0 & 1 & \ldots & 1 & 0 & 1 & 0 & 1 \\ 0 & 0 & 1 & 1 & 0 & 0 & 1 & 1 & 0 & 0 & 1 & 1 & 0 & & 1 & 1 & 0 & 0 & & 1 & 0 & 0 & 1 & 1 \\ 0 & 0 & 0 & 0 & 1 & 1 & 1 & 1 & 0 & 0 & 0 & 0 & 1 & \ldots & 1 & 1 & 0 & 0 & \ldots & 0 & 1 & 1 & 1 & 1 \\ \vdots & & & & & & & & & & & & & & \vdots & & \vdots & & \vdots & & \vdots & & & \vdots \\ 0 & 0 & 0 & 0 & 0 & 0 & 0 & 0 & 0 & 0 & 0 & 0 & \ldots & 0 & 0 & 1 & 1 & \ldots & 1 & 1 & 1 & 1 & 1 \\ 0 & 1 & 1 & 0 & 1 & 0 & 0 & 1 & 1 & 0 & 0 & 1 & 0 & & 1 & 0 & 1 & 0 & & 0 & 1 & 0 & 0 & 1 \\ 0 & 0 & 0 & 0 & 0 & 0 & 0 & 0 & 0 & 0 & 0 & 0 & \ldots & 0 & 0 & 0 & 0 & \ldots & 0 & 0 & 0 & 0 & 0 \\ \vdots & & & & & & & & & & & & & & \vdots & & \vdots & & \vdots & & \vdots & & & \vdots \\ 0 & 0 & 0 & 0 & 0 & 0 & 0 & 0 & 0 & 0 & 0 & 0 & \ldots & 0 & 0 & 0 & 0 & \ldots & 0 & 0 & 0 & 0 & 0 \end{bmatrix} \quad (21)$$

The lane encoder matrix $M_2$ has size $(n+m+2) \times M$. Its first n rows are zero, the next m+2 rows contains a The $G_p$ section of an M+m+2 SECDED code matrix. Note that the lower non-zero row of $M_1$ and the upper non-zero row of $M_2$ overlap.

The choice for the $(m+2) \times M$ sub matrix formed by the last m+2 rows of $M_2$ can be the generator matrix of an (M+m+2, M, 4) extended Hamming code. For M=8.

$$M_2 = \begin{bmatrix} 0 & 0 & 0 & 0 & 0 & 0 & 0 & 0 \\ \vdots & & & & & & & \vdots \\ 0 & 0 & 0 & 0 & 0 & 0 & 0 & 0 \\ 1 & 1 & 1 & 1 & 1 & 0 & 0 & 0 \\ 1 & 1 & 1 & 0 & 0 & 1 & 1 & 0 \\ 1 & 0 & 0 & 1 & 1 & 1 & 1 & 0 \\ 0 & 1 & 0 & 1 & 0 & 1 & 1 & 1 \\ 0 & 0 & 1 & 0 & 1 & 0 & 1 & 1 \end{bmatrix} \quad (22)$$

The matrix $G_p$ can be formed from $M_1$, $M_2$, $P_1$, and $P_2$, by:

$$G_p [M_1 \; M_2] \cdot \begin{bmatrix} P_1 \\ P_2 \end{bmatrix} = M_1 \cdot P_1 + M_2 \cdot P_2 \quad (23)$$

The first n rows of $G_p$ contain the word address.

In terms of 2D code masks as in Table 1:

TABLE 2

Address masks for a T = 64, K = 8, M = 8 SECDED codes

|  | mask[0] | mask[1] | mask[2] | mask[3] | mask[4] | mask[5] | mask[6] | mask[7] |
|---|---|---|---|---|---|---|---|---|
| $b_0$ | 0 | 1 | 0 | 1 | 0 | 1 | 0 | 1 |
| $b_1$ | 0 | 0 | 1 | 1 | 0 | 0 | 1 | 1 |
| $b_2$ | 0 | 0 | 0 | 0 | 1 | 1 | 1 | 1 |
| $b_3$ | 0 | 1 | 1 | 0 | 1 | 0 | 0 | 1 |

TABLE 2-continued

Address masks for a T = 64, K = 8, M = 8 SECDED codes

|       | mask[0] | mask[1] | mask[2] | mask[3] | mask[4] | mask[5] | mask[6] | mask[7] |
|-------|---------|---------|---------|---------|---------|---------|---------|---------|
| $b_4$ | 0       | 0       | 0       | 0       | 0       | 0       | 0       | 0       |
| $b_5$ | 0       | 0       | 0       | 0       | 0       | 0       | 0       | 0       |
| $b_6$ | 0       | 0       | 0       | 0       | 0       | 0       | 0       | 0       |
| $b_7$ | 0       | 0       | 0       | 0       | 0       | 0       | 0       | 0       |

The bold faced bits are the n=3 word address bits.

The present techniques may also be described as below in the form of C program code providing the functionality of the circuitry previously discussed above.

The compile preprocessor flag BYTE_ADDR Selects the lane addressable code as per Table 2. Otherwise the Table 1 masks are used, this gives the fastest circuits hamm2_2x39d_72e: Dual lane (39,32,4) decode followed by a 2×32 bus merge and (72,64,4) re-encode.

Although example embodiments have been described in detail herein with reference to the accompanying drawings, it is to be understood that the claims are not limited to those precise embodiments, and that various changes and modifications can be effected therein by one skilled in the art without departing from the scope and spirit of the claims.

We claim:

1. Apparatus for generating C-bit payload check data from K-bits of payload data formed of N M-bit words, where K=N*M and N and M are integers greater than one, said apparatus comprising:
N lane encoders configured to operate in parallel to each generate lane check data from a respective M-bit word using a common processing operation; and
mask circuitry coupled to said N lane encoders and configured to receive lane check data from each of said N lane encoders and to generate said C-bit payload check data.

2. Apparatus as claimed in claim 1, wherein said lane check data for said M-bit word has a value given by a matrix multiplication of an encoder matrix with said M-bit word, said encoder matrix being common for each of said N lane encoders.

3. Apparatus as claimed in claim 2, wherein said mask circuitry uses N distinct C-bit mask values, said C-bit payload check data having a value given by binary finite field addition of each of said N distinct C-bit mask values to respective different lane check data to form N C-bit check code portions and binary finite field addition of said N C-bit check code portions to form said C-bit payload check data.

4. Apparatus as claimed in claim 3, wherein said mask circuitry is responsive to an order select signal to select which of said N distinct C-bit mask values are subject to a binary finite field addition with lane check data from which of said N lane encoders.

5. Apparatus as claimed in claim 4, wherein said K-bits of payload data has associated C-bit input payload check data previously calculated from said K-bits of payload data and said order select signal is controlled such that said C-bit payload check data is formed with a selection of which said N distinct C-bit mask values are subject to a binary finite field addition with lane check data from which of said N lane encoders such that said C-bit payload check data matching said C-bit input payload check data if said payload data is error free.

6. Apparatus as claimed in claim 2, wherein said encoder matrix has binary elements with values such that said lane check data for each M-bit word concatenated with said M-bit word provides a systematic code with minimum Hamming distance T, where T is one of T=3 and T=4 for said M-bit word.

7. Apparatus as claimed in claim 2, wherein said encoder matrix and said N distinct C-bit mask values are formed such that said C-bit payload check data concatenated with said K-bits of payload data provides a systematic code with minimum Hamming distance T, where T is one of T=3 and T=4 for said K-bits of payload data.

8. Apparatus as claimed in claim 1, wherein said lane check data for said M-bit word has a value given by a polynomial division operation performed upon said M-bit word, said polynomial division operation being common for each of said N lane encoders.

9. Apparatus as claimed in claim 1, wherein said K-bits of payload data has associated C-bit input payload check data previously calculated from said K-bits of payload data
and further comprising syndrome generating circuitry responsive to said C-bit input check data and said C-bit check data to generate a syndrome value.

10. Apparatus as claimed in claim 9, wherein said syndrome generating circuitry performs a binary finite field addition operation upon said C-bit input payload check data and said C-bit payload check data to generate said syndrome value.

11. Apparatus as claimed in claim 9, further comprising error detection circuitry responsive to said syndrome value to detect when said K-bits of payload data are error free and said C-bit input payload check data contains a single bit error and to trigger multiplexer circuitry to select said C-bit payload check data to be associated with said K-bits of payload data in place of said C-bit input payload check data.

12. Apparatus as claimed in claim 1, wherein said K-bits of payload data has associated C-bit input payload check data previously calculated from said K-bits of payload data and said apparatus serves to split said K-bits of payload data into Z sections of payload data of size K(z) bits.

13. Apparatus as claimed in claim 12, wherein said mask circuitry comprises Z mask circuitry sections each corresponding to a respective one of said Z sections of payload data and
(i) each of Z mask circuitry sections forms respective partial check data, respective partial check data from said Z mask circuitry sections being concatentated to form said C-bit payload check data that matches said C-bit input check data if said K-bits of payload data is error free; and
(ii) at least one of said Z mask circuitry sections forms section check data that concatenated with said section of K(z) bits of payload data provides a systematic code for said section of K(z) bits of payload data.

14. Apparatus as claimed in claim 13, wherein said systematic code for said section of K(z) bits of payload data has a minimum Hamming distance T, where T is one of T=3 and T=4.

15. Apparatus as claimed in claim 13, wherein for a first of said Z sections of payload data only said partial check data is formed, said partial check data for said first of said Z sections of payload data being concatenated with said first of said Z sections of payload data to provide a systematic code for said first of said Z sections of payload data.

16. Apparatus as claimed in claim 13, wherein a mask value used in calculating said partial check data is all zeros and a mask value used in calculating said section check data is all zeros.

17. Apparatus as claimed in claim 13, wherein said section check data provides a systematic code for said section of K(z) bits of payload data and has a minimum Hamming distance T, where T is one of T=3 and T=4.

18. Apparatus as claimed in claim 1, wherein said K-bits of payload data comprises Z sections of size K(z) bits to be merged and each of said Z sections has an associated C-bit input payload check data previously calculated from said section of said K-bits of payload data.

19. Apparatus as claimed in claim 18, wherein said mask circuitry comprises Z mask circuitry sections each corresponding to a respective one of said Z sections of payload data and
(i) each of Z mask circuitry sections forms respective partial check data, respective partial check data from said Z mask circuitry sections being concatentated to form said C-bit payload check for said K-bits of payload data; and
(ii) each said Z mask circuitry sections forms section check data that matches said associated C-bit input check data for said section if said K(z) bits of payload data for said section is error free.

20. Apparatus as claimed in claim 19 wherein for a first of said Z sections of payload data said partial check data and said section check data are identical and said mask circuitry section for said first of said Z sections of payload data generates a single value that serves as both said partial check data and said section check data for said first of said Z sections of payload data.

21. Apparatus as claimed in claim 19, wherein a mask value used in calculating said partial check data is all zeros and a mask value used in calculating said section check data is all zeros.

22. Apparatus for generating C-bit payload check data from K-bits of payload data having associated C-bit input payload check data previously calculated from said K-bits of payload data, said apparatus comprising:
N lane encoder circuits for operating in parallel to each generate lane check data from a respective M-bit word using a common processing operation;
mask circuitry coupled to said N lane encoder circuits receiving lane check data from each of said N lane encoder circuits and for generating said C-bit payload check data;
syndrome generating circuitry responsive to said C-bit input check data and said C-bit check data to generate a syndrome value given by performing a binary finite field addition operation upon said C-bit input payload check data and said C-bit payload check data to generate said syndrome value;
error detection circuitry responsive to said syndrome value to detect when said K-bits of payload data are error free and said C-bit input payload check data contains a single bit error; and
multiplexer circuitry responsive to said error detetcion circuitry to select said C-bit payload check data to be associated with said K-bits of payload data in place of said C-bit input payload check data when said C-bit input payload check data is detected as containing a single bit error.

23. Apparatus for generating C-bit payload check data from K-bits of payload data formed of N M-bit words, where K=N*M and N and M are integers greater than one, said apparatus comprising:
N lane encoder means for operating in parallel to each generate lane check data from a respective M-bit word using a common processing operation; and
mask means coupled to said N lane encoder means receiving lane check data from each of said N lane encoder means and for generating said C-bit payload check data.

24. Apparatus for generating C-bit payload check data from K-bits of payload data formed of N M-bit words, where K=N*M and N and M are integers greater than one, having associated C-bit input payload check data previously calculated from said K-bits of payload data, said apparatus comprising:
N lane encoder means for operating in parallel to each generate lane check data from a respective M-bit word using a common processing operation;
mask means coupled to said N lane encoder means receiving lane check data from each of said N lane encoder means and for generating said C-bit payload check data;
syndrome generating means responsive to said C-bit input check data and said C-bit check data for generating a syndrome value given by performing a binary finite field addition operation upon said C-bit input payload check data and said C-bit payload check data to generate said syndrome value;
error detection means responsive to said syndrome value for detecting when said K-bits of payload data are error free and said C-bit input payload check data contains a single bit error; and
multiplexer means responsive to said error detetcion circuitry for selecting said C-bit payload check data to be associated with said K-bits of payload data in place of said C-bit input payload check data when said C-bit input payload check data is detected as containing a single bit error.

25. A method of generating C-bit payload check data from K-bits of payload data formed of N M-bit words, where K=N*M and N and M are integers greater than one, said method comprising the steps of:
generating in parallel, by N lane encoders, lane check data from a respective M-bit word using a common processing operation; and
generating, by logic circuitry, said C-bit payload check data from said lane check data generated in parallel.

26. A method of generating C-bit payload check data from K-bits of payload data formed of N M-bit words, where K=N*M and N and M are integers greater than one, having associated C-bit input payload check data previously calculated from said K-bits of payload data, said method comprising the steps of:
generating in parallel lane check data from a respective M-bit word using a common processing operation;
generating said C-bit payload check data from said lane check data generated in parallel;
in response to said C-bit input check data and said C-bit check data, generating a syndrome value given by performing a binary finite field addition operation upon said C-bit input payload check data and said C-bit payload check data to generate said syndrome value;

in response to said syndrome value, detecting when said K-bits of payload data are error free and said C-bit input payload check data contains a single bit error; and selecting said C-bit payload check data to be associated with said K-bits of payload data in place of said C-bit input payload check data when said C-bit input payload check data is detected as containing a single bit error.

* * * * *